United States Patent
Kuo et al.

(10) Patent No.: US 7,433,228 B2
(45) Date of Patent: Oct. 7, 2008

(54) MULTI-BIT FLASH MEMORY DEVICE HAVING IMPROVED PROGRAM RATE

(75) Inventors: Tiao-Hua Kuo, San Jose, CA (US); Nancy Leong, Sunnyvale, CA (US); Hounien Chen, Fremont, CA (US); Sachit Chandra, Sunnyvale, CA (US); Nian Yang, Mountain View, CA (US)

(73) Assignee: Spansion LLC, Sunnyvale, CA (US)

( * ) Notice: Subject to any disclaimer, the term of this patent is extended or adjusted under 35 U.S.C. 154(b) by 150 days.

(21) Appl. No.: 11/229,519

(22) Filed: Sep. 20, 2005

(65) Prior Publication Data

US 2007/0064480 A1 Mar. 22, 2007

(51) Int. Cl.
G11C 16/04 (2006.01)

(52) U.S. Cl. .............................. 365/185.05; 365/185.08

(58) Field of Classification Search ............ 365/185.05, 365/185.08, 185.33
See application file for complete search history.

(56) References Cited

U.S. PATENT DOCUMENTS

| | | | |
|---|---|---|---|
| 5,291,446 A | 3/1994 | Van Buskirk et al. | 365/189.09 |
| 5,301,097 A | 4/1994 | McDaniel | |
| 5,430,674 A | 7/1995 | Javaniford | |
| 5,539,688 A | 7/1996 | Yiu et al. | |
| 5,638,326 A | 6/1997 | Hollmer et al. | 365/185 |
| 5,890,192 A | 3/1999 | Lee et al. | |
| 5,892,710 A | 4/1999 | Fazio et al. | |
| 6,044,022 A | 3/2000 | Nachumovsky | |
| 6,101,125 A | 8/2000 | Gorman | |
| 6,272,670 B1 | 8/2001 | Van Myers et al. | |
| 6,295,228 B1 | 9/2001 | Pawletko et al. | 365/185.22 |
| 6,327,181 B1 | 12/2001 | Akaogi et al. | 365/185 |
| 6,424,570 B1 | 7/2002 | Le et al. | 365/185 |
| 6,426,893 B1 | 7/2002 | Conley et al. | |
| 6,452,869 B1 | 9/2002 | Parker | 365/238 |
| 6,487,121 B1 | 11/2002 | Thurgate et al. | 365/185 |
| 6,496,410 B1 | 12/2002 | Parker | |
| 6,535,419 B2 * | 3/2003 | Parker et al. | 365/185.03 |

(Continued)

FOREIGN PATENT DOCUMENTS

WO   WO 03/063167 A2   7/2003

(Continued)

OTHER PUBLICATIONS

Co-pending U.S. Appl. No. 11/212,614, filed Aug. 29, 2005, entitled: "Voltage Regulator with Less Overshoot and Faster Settling Time," Yonggang Wu et al.; 30 pp.

(Continued)

Primary Examiner—Vu A Le
(74) Attorney, Agent, or Firm—Harrity Snyder, LLP

(57) ABSTRACT

A method is provided for programming a nonvolatile memory array including an array of memory cells, where each memory cell including a substrate, a control gate, a charge storage element having at least two charge storage areas for storing at least two independent charges, a source region and a drain region. The method includes designating at least one memory cell as a high-speed memory cell and pre-conditioning the high-speed memory cells by placing a first of the at least two charge storage areas into a programmed state, and subsequently enabling the programming on the second area with much higher rate.

22 Claims, 9 Drawing Sheets

U.S. PATENT DOCUMENTS

| | | | |
|---|---|---|---|
| 6,538,923 B1 | 3/2003 | Parker | 365/185 |
| 6,570,785 B1 | 5/2003 | Mangan et al. | |
| 6,724,662 B2 | 4/2004 | Manea | |
| 6,747,900 B1 | 6/2004 | Park et al. | 365/185 |
| 6,775,187 B1 | 8/2004 | Hamilton et al. | |
| 6,816,001 B2 | 11/2004 | Khouri et al. | |
| 6,952,366 B2* | 10/2005 | Forbes | 365/185.08 |
| 6,996,021 B2* | 2/2006 | Derner et al. | 365/210 |
| 7,020,018 B2 | 3/2006 | Hsieh et al. | |
| 7,149,110 B2 | 12/2006 | Tran et al. | |
| 7,151,701 B2 | 12/2006 | Combe et al. | |
| 7,177,184 B2* | 2/2007 | Chen | 365/185.03 |
| 7,190,616 B2* | 3/2007 | Forbes et al. | 365/185.05 |
| 2001/0040836 A1 | 11/2001 | Mori et al. | |
| 2002/0167844 A1 | 11/2002 | Han et al. | |
| 2003/0093233 A1 | 5/2003 | Rajguru | |
| 2003/0142544 A1 | 7/2003 | Maayan et al. | |
| 2003/0172309 A1 | 9/2003 | Cioaca | |
| 2004/0027857 A1 | 2/2004 | Ooishi | |
| 2004/0037113 A1 | 2/2004 | Ooishi | |

FOREIGN PATENT DOCUMENTS

| | | |
|---|---|---|
| WO | WO 2005/106891 A1 | 11/2005 |

OTHER PUBLICATIONS

Co-pending U.S. Appl. No. 11/229,664, filed Sep. 20, 2005, entitled: "Flash Memory Programming Using an Indication Bit to Interpret State," Takao Akaogi et al.; 25 pp.

2002 IEEE International Solid-State Circuits Conference, Session 6, "SRAM and Non-Volatile Memories," Feb. 4, 2004, 6 pages.

2002 IEEE International Solid-State Circuits Conference, 23 pages.

* cited by examiner

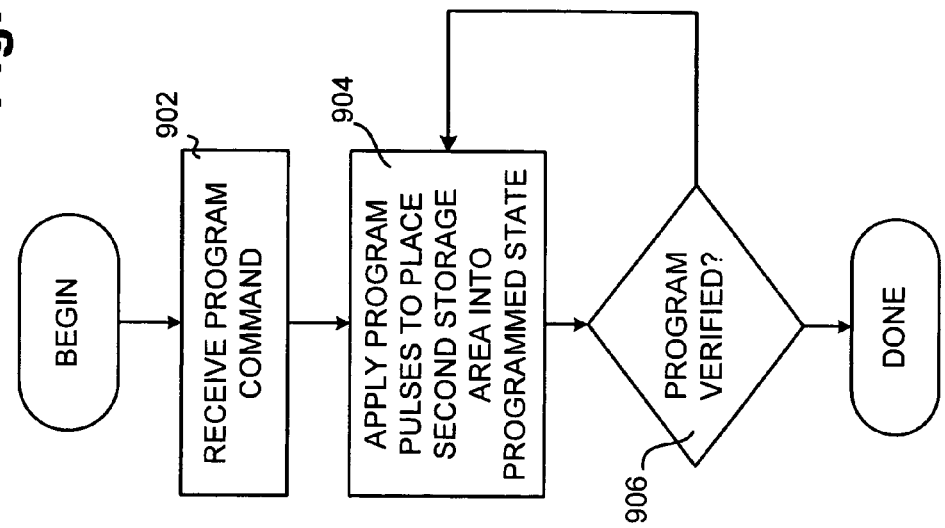
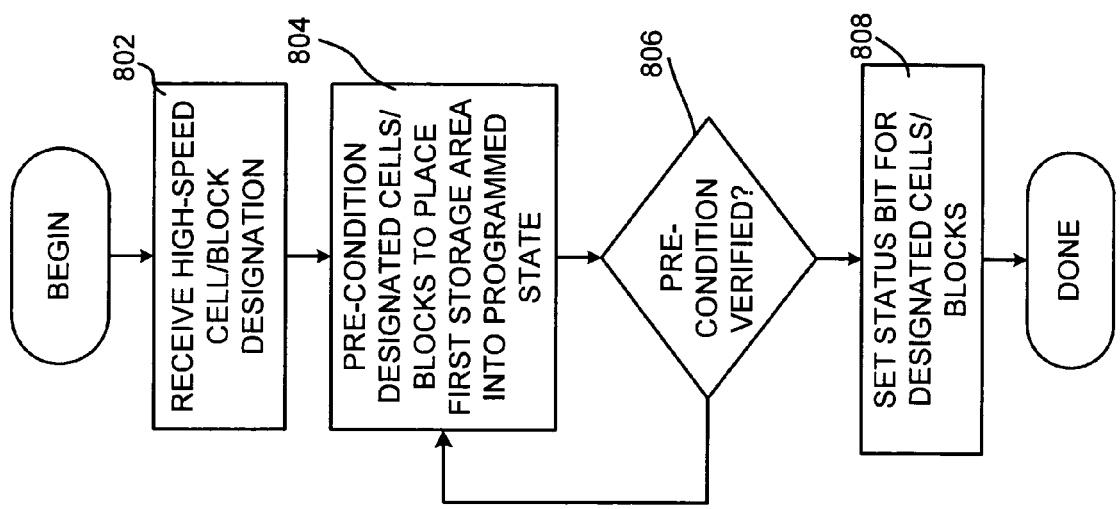

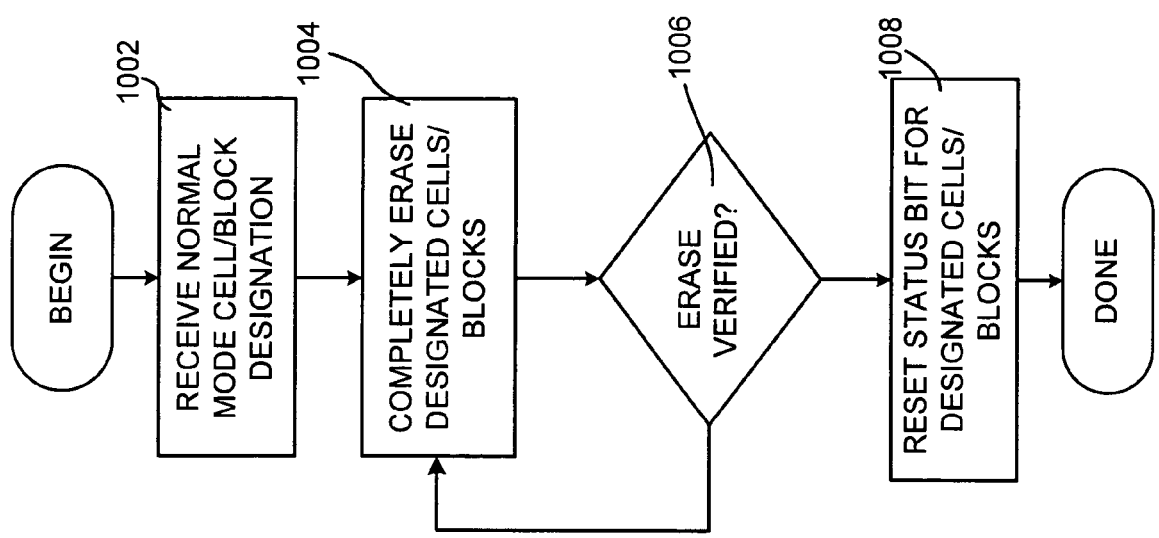

MULTI-BIT FLASH MEMORY DEVICE HAVING IMPROVED PROGRAM RATE

TECHNICAL FIELD

The present invention relates generally to non-volatile memory devices, and more specifically, to improving operations associated with non-volatile memory devices.

BACKGROUND ART

Flash memory is a common type of non-volatile semiconductor memory device. Non-volatile refers to the retaining of stored data when power is turned off. Because flash memory is non-volatile, it is commonly used in power conscious applications, such as in battery powered cellular phones, personal digital assistants (PDAs), and in portable mass storage devices such as memory sticks.

Flash memory devices typically include multiple individual components formed on or within a substrate. For example, a flash memory may include one or more high density core regions and a peripheral portion formed on a single substrate. The high density core regions typically include arrays of individually addressable, substantially identical memory cells. The peripheral portion may include input/ output (I/O) circuitry, circuitry for selectively addressing the individual cells (such as decoders for connecting the source, gate and drain of selected cells to predetermined voltages or impedances to effect designated operations of the cell such as programming, reading or erasing), and voltage regulation and supply circuitry.

In a conventional flash memory architecture, memory cells within the core portion are coupled together in a circuit configuration in which each memory cell has a drain, a source, and a stacked gate. In operation, memory cells may be addressed by circuitry in the peripheral portion to perform functions such as reading, erasing, and programming of the memory cells.

Flash memory typically includes two distinct types: NOR flash memory, and NAND flash memory. Generally speaking, conventional NOR flash memory is considered to be a code-level memory, while NAND flash memory is considered to be a data-level memory. More specifically, NOR flash memory is typically configured to provide a very reliable storage environment and to further enable fast and random reading of each memory cell in the device. This is accomplished by providing individual contacts to each cell in the device. The reliability and random access nature of the NOR architecture make NOR flash memory particularly suitable for code storage, such as mobile phone and set top box operating systems, etc. Unfortunately, the individually addressable nature of conventional NOR flash memory cells tends to limit the speed at which cells may be programmed and erased as well as limit rapid reductions in device sizes. Typical NOR flash memory devices have program rates on the order of 0.4 megabytes per second (MB/s) and erase rates on the order of 0.3 MB/s.

NAND flash memory, on the other hand, is configured to enable serial or page-based access to data stored therein. This is accomplished by linking memory cells to each other and only providing access to the cells as a group or page. This architecture has the advantage of enabling decreased device sizes and also for providing fast write times. However, because each cell is not individually addressable, NAND devices are generally considered less reliable and therefore more suitable for data storage than code storage. Typical NAND flash memory devices have program rates on the order of 8 MB/second and erase rates on the order of 60 MB/second.

DISCLOSURE OF THE INVENTION

One aspect of the invention is directed to a method for programming a nonvolatile memory device including an array of memory cells, where each memory cell includes a charge storage element having at least two charge storage areas for storing at least two independent charges. The method includes designating a plurality of memory cells as high-speed memory cells and pre-conditioning the high-speed memory cells to place a first one of the at least two charge storage areas associated with each of the high-speed memory cells into a programmed state.

Another aspect is directed to a method for programming a memory device including an array of non-volatile memory cells, each memory cell including a charge storage element having two charge storage areas for storing two independent charges. The method includes configuring the array of non-volatile dual-bit memory cells into one or more blocks of memory cells; receiving a request to use at least one block of memory cells as a high-speed block; pre-conditioning the memory cells in the high-speed block to place a first of the at least two charge storage areas for each memory cell in the high-speed block into a programmed state; and setting a status bit associated with the high-speed block to indicate that the block is a high-speed block.

Yet another aspect is directed to a memory device including a core array having at least one array of non-volatile memory cells. The at least one array may include a plurality of bit lines each connected to source or drain regions of a plurality of the memory cells. The plurality of memory cells may include a substrate, a control gate, a charge storage element having at least two charge storage areas for storing at least two independent charges, a source region, and a drain region. The at least one array may also include a plurality of word lines, arranged orthogonally to the bit lines, each word line being connected to gate regions of a plurality of the memory cells. A plurality of sense amplifiers may be operatively connected to the plurality of bit lines for sensing a threshold voltage for memory cells connected to the bit lines. Control logic may be configured to receive a command identifying one or more memory cells to be configured as high-speed memory cells. Control logic may be configured to pre-condition a first of the at least two charge storage areas of each of the high-speed memory cells to place the first charge storage area into a programmed state. Control logic maybe configured to set a status bit associated with the one or more memory cells, indicating that the one or more memory cells are high-speed memory cells.

Still another aspect of the invention is directed toward a memory device including an array of memory cells. The array of memory cells may include a first plurality of memory cells configured as normal mode memory cells, and a second plurality of memory cells configured as high-speed mode memory cells.

BRIEF DESCRIPTION OF THE DRAWINGS

Reference is made to the attached drawings, wherein elements having the same reference number designation may represent like elements throughout.

FIG. 8 is a flow chart illustrating exemplary pre-conditioning of a memory device such as the memory device shown in FIG. 1;

FIG. 9 is a flow chart illustrating exemplary programming of a pre-conditioned memory device such as the memory device shown in FIG. 1; and FIG. 10 is a flow chart illustrating exemplary normal mode designation of a memory device such as the memory device shown in FIG. 1

BEST MODE FOR CARRYING OUT THE INVENTION

Techniques described below relate to a flash memory programming technique in which program speed is substantially increased.

Memory Device Overview

Figure 1:
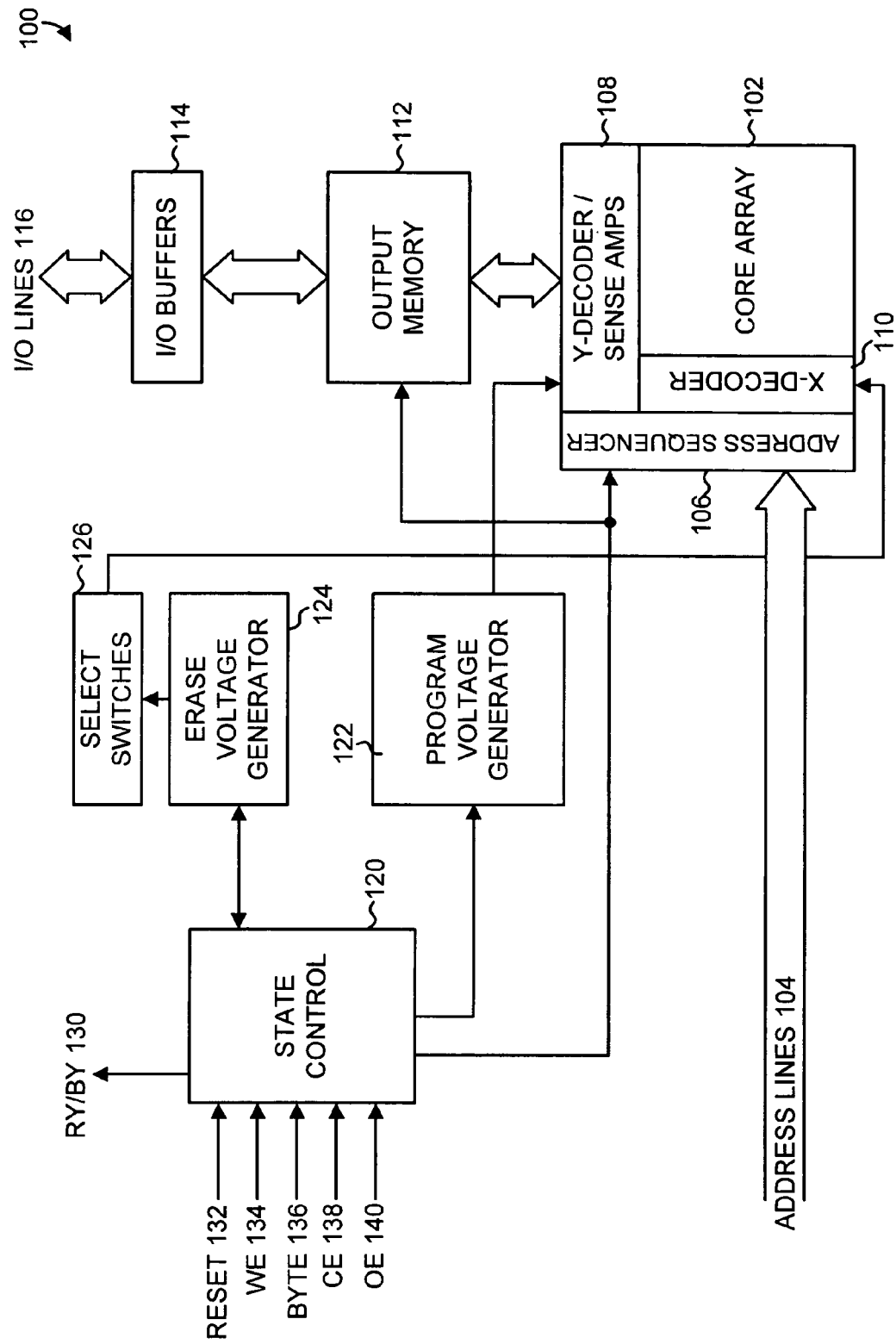
FIG. 1 is a block diagram illustrating an exemplary high-level implementation of a memory device.

FIG. 1 is a block diagram illustrating an exemplary high-level implementation of a memory device 100. Memory device 100 may be a flash memory device implemented as an integrated circuit.

As shown in FIG. 1, memory device 100 includes a core array 102. Core array 102 may include arrays of high density memory cells, such as, for example, SONOS-type (silicon-oxide-nitride-oxide-silicon) NOR memory cells, where the nitride layer acts as the charge storage element. More specifically, core array 102 may include multiple M×N memory arrays of substantially identical memory cells. As will be discussed in more detail below, core array 102 may be a sequential access memory in which memory cells may be accessed in designated groups, such as pages or partial pages. In this manner, core array 102 may adopt a NAND-like interface structure with output memory 112, regardless of the inherent array structure (e.g., NOR or virtual ground type) contained within the memory device 100. Physically, in one implementation consistent with principles of the invention, a page of data may refer to a series of rows (e.g., four sequential rows) of memory cells in core array 102. It should be understood that a page of data may include any suitable number of rows. Logically, pages can be thought of as blocks of data having predetermined sizes through which memory device 100 is accessed. In one implementation, the page size for memory device 100 is two thousand and forty eight bytes or two kilobytes.

Core array 102 may be accessed by providing an address for a page via address lines 104 to address sequencer 106. Address sequencer 106 may receive input address values and distribute them to Y-decoder 108 and X-decoder 110. Decoders 108 and 110 may decode the address values so that the source, gate, and drains of the memory cells referred to by the received addresses are activated and their data values read or programmed. The decoded addresses specify the appropriate physical lines in the memory cell array(s) that are to be used. For instance, a page of data may be activated and read out of core array 102 in parallel. The read data may be written to output memory 112 before being clocked to input/output (I/O) buffers 114 and read out via I/O lines 116. Y-decoder 108 may also include appropriate sense amplifier circuitry. Sense amplifiers may be used to sense the programmed or non-programmed state of the memory cells in core area 102. Sense amplifiers consistent with the invention may be low power sense amplifiers, as described in additional detail below.

In some implementations, the memory cells in array 102 may be implemented such that each memory cell can store two or more bits of data. In one such multi-bit per memory cell technology, called MirrorBit™, the intrinsic density of a flash memory array can be doubled by storing two physically distinct charges on opposite sides of a memory cell. Each charge, representing a bit within a cell serves as binary unit of data (e.g. either "1" or "0"). Reading or programming one side of a memory cell occurs independently of the data that is stored on the opposite side of the cell.

Output memory 112 may include static random access memory (SRAM) or dynamic random access memory (DRAM) type memory that can serve as a memory cache between core area 102 and I/O buffers 114. Output memory 112 may thus be a volatile memory (i.e., loses its data when powered down) and, relative to the memory cells in core array 102, may be a high-speed memory.

As also shown in FIG. 1, memory device 100 can include a number of additional logic components that assist in reading/writing to core array 102. In particular, as shown, memory device 100 includes a state control component 120, a program voltage generator 122, an erase voltage generator 124, and select switches 126. These elements are shown in FIG. 1 as separate elements. It should be understood that the functions performed by two or more of these components may alternatively be performed by a single component.

State control component 120 may implement a state machine that dictates the function of memory device 100 based on a number of control signals, illustrated as the signals: reset line 132, write enable (WE) line 134, byte line 136, chip enable (CE) line 138, and output enable (OE) line 140. Reset line 132, when activated, causes a hardware reset of memory device 100. Write enable line 134 enables writing of data to core array 102. Byte line 136 selects the width of the output data bus. For example, byte line 136 may cause I/O lines 116 to function as an eight-bit data bus or a sixteen-bit data bus, depending on the state of byte line 136. Chip enable line 138 enables the reading/writing of data to memory device 100. When chip enable line 138 is held at its designated non-active level, the output pins of memory device 100 may be placed in a high impedance (non-active) state. To activate the memory device 100, chip enable line 138 may be held in its active state. Output enable line 140 enables reading of data from core array 102 and outputting the data via I/O lines 116.

Program voltage generator 122 and erase voltage generator 124 may generate the appropriate voltages needed for reading, programming, and erasing from/to core array 102. For example, in one implementation, core array 102 may require relatively high voltages to program and erase the memory cells in core array 102. These higher voltages may be provided from program voltage generator 122 and erase voltage generator 124. Select switches 126 may include select transistors connected to core array 102. Each select switch may be used to control a series of memory cells, such as a column of memory cells.

Also shown in FIG. 1 is ready/busy (RY/BY) line 130. Ready/busy line 130 may indicate when memory device 100 is performing an program or erase operation. More specifically, when in the "busy" state, ready/busy line 130 indicates that memory device 100 is currently performing a program or erase operation. When in the "ready" state, ready/busy line 130 indicates that memory device 100 is not currently performing a program or erase operation.

Figure 2:
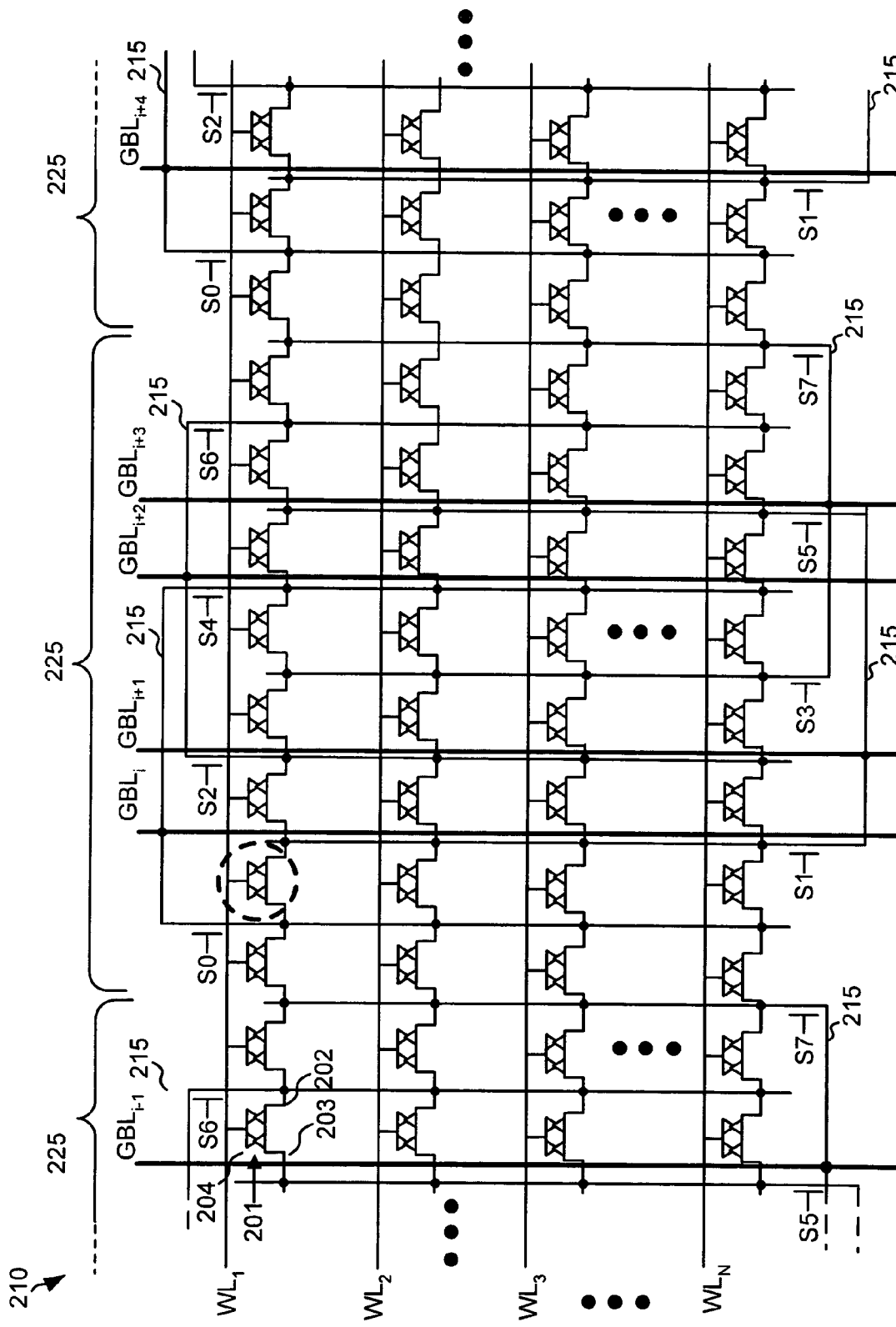
FIG. 2 is a diagram illustrating an exemplary portion of an array of memory cells implemented in the core area shown in FIG. 1.

FIG. 2 is a diagram illustrating an exemplary portion of an array of memory cells implemented in core area 102, labeled as memory array 210. The array includes a number of substantially identical memory cells 201. Each memory cell 201 includes a drain 202, a source 203, and a stacked gate region 204. Drain 202 and source 203 are interchangeable within a memory cell depending on the applied voltages and may be switched with respect to one another. The configuration illustrated in FIG. 2 includes word lines (word lines $WL_1$ through $WL_N$) each connected to the gate region 204 of a number of memory cells in a row. Bit lines are arranged orthogonally to the word lines in array 210. The bit lines include global bit lines ($GBL_{i-1}$ through $GBL_{i+4}$) that each connect to one or more additional bit lines 215. Voltages placed on additional bit lines 215 via a global bit line GBL may be controlled through select transistors (also called select switches) S0 through S7.

As illustrated in FIG. 2, select transistors S0 through S7 may be arranged in repeating groups 225 of select transistors. Corresponding select transistors in a number of groups may be controlled by the same control signal. For example, activating select transistor S0 may connect the particular bit line connected to S0 to voltages applied to $GBL_i$, $GBL_{i+2}$, etc. If select transistor S1 was also activated, $GBL_{i+1}$, $GBL_{i+3}$, etc., would also be connected to the opposing source/drain of a number of memory cells in memory array 210. By also activating a word line WL, one memory cell in each group 225 may have its source, drain, and gate terminals all activated, thus allowing programming or reading of this select memory cell 201. As an example of selecting a particular memory cell 201 within a group 225 (e.g., the memory cell within the dotted circle in FIG. 2), assume that a voltage is placed on $WL_1$ and that S0 and S1 are turned-on and that voltages are placed on $GBL_i$ and $GBL_{i+1}$. At this point, this cell has voltages applied to its gate, source, and drain and may be programmed or read. Other memory cells 201 in other groups 225 can be simultaneously selected based on activation of the same WL and select transistors.

Although only six global bit lines and four word lines are shown in FIG. 2, one of ordinary skill in the art will recognize that a typical memory cell architecture will include many more cells in an array. For instance, in one implementation, core array 102 may include multiple memory cell arrays, each including 2048 bit lines and 256 word lines. The 2048 bit lines correspond to 256 eight memory cell groups 225 of select transistors.

Although the memory cells 201 in core area 102 are organized as NOR memory cells, in some implementations, the circuitry in the peripheral regions of memory device 100 may provide an external interface that mimics an external interface normally provided by NAND-type flash memories. In this situation, memory device 100, from the point of view of the user/circuit designer, can effectively be thought of as a NAND-type flash device even though core area 102 has been used as NOR-type flash memory.

Figure 3:
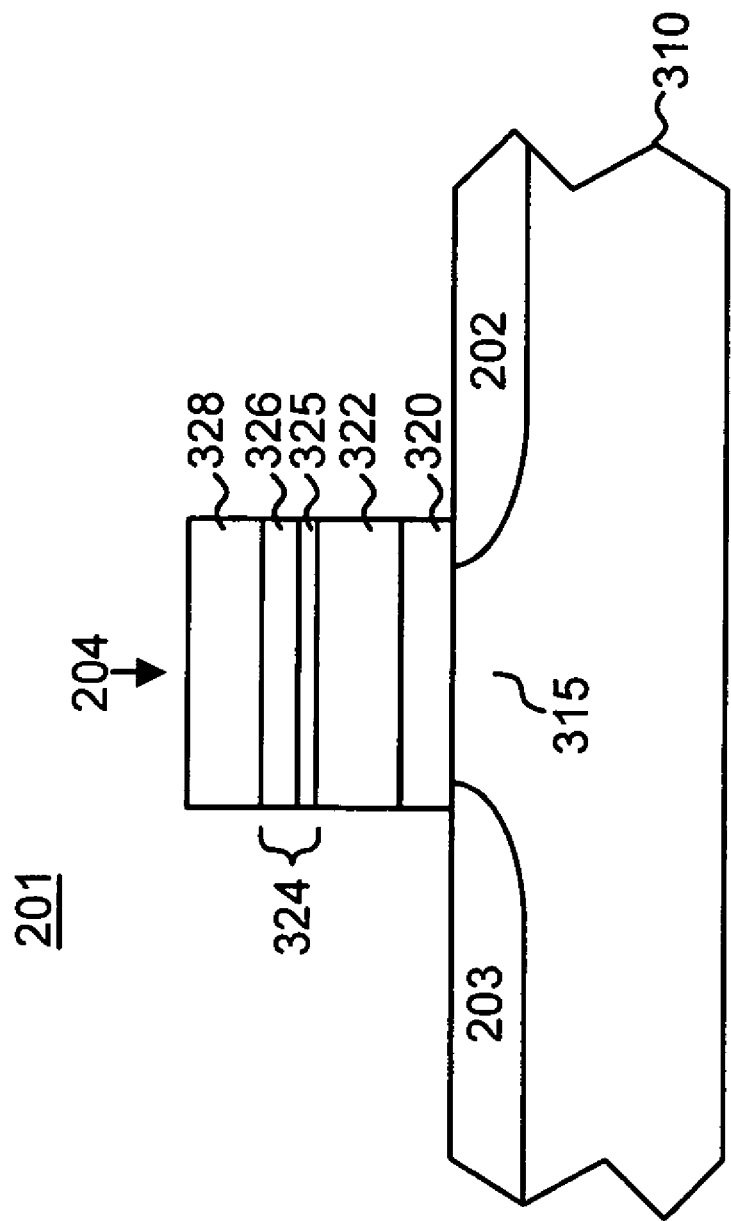
FIGS. 3 and 4 are diagrams illustrating a cross-section of an exemplary one of the memory cells shown in FIG. 2.

FIG. 3 is a diagram illustrating a cross-section of an exemplary one of memory cells 201 in more detail. Memory cell 201 may be formed on a substrate 310 and includes drain 202, source 203, and stacked gate 204. Substrate 310 may be formed of a semiconductor material such as silicon, germanium, or silicon-germanium. Drain and source regions 202 and 203 may be regions that are doped with n-type impurities, such as phosphorous or arsenic. As previously mentioned, depending on the applied voltage values, the functions of drain and source regions 202 and 203 may be reversed.

As shown in FIG. 3, stacked gate 204 is formed on channel region 315. Stacked gate 204 includes a number of layers, including a relatively thin gate dielectric layer 320, a charge storage layer 322, a second dielectric layer 324, and a control gate 328. Dielectric layer 320 may include an oxide, such as a silicon oxide (e.g., $SiO_2$).

Charge storage layer 322 may be formed on gate dielectric layer 320 and may include a dielectric material, such as a nitride (e.g., a silicon nitride). Layer 322 acts as a charge storage layer for memory cell 201.

Charge storage layer 322 may be used to store one or more bits of information. In an exemplary implementation, charge storage layer 322 may store charges representing two separate bits of data by localizing the first and second charges to the respective left and right sides of charge storage layer 322. Each of the two charges of the memory cell 201 may be programmed independently by, for example, channel hot electron injection, to store a charge on each respective side of charge storage layer 322 and the density of the resulting memory array may be increased as compared to memory devices that store only one bit of data per cell. During erasing, the charges stored in charge storage layer 322 may be neutralized by the hot hole injected into the respective area of the storage layer 322, or may tunnel through bottom oxide layer 320 into the source region and drain region 203, 202, respectively. In this manner, the density of an array of multiple memory cells 201 may be increased as compared to conventional memory devices that store charge representing only one bit of data per cell. In alternate implementations, charge storage layer 322 may store charges representing three or more bits of data for each memory cell 201 by further refining the amount of charges placed on each side of layer 322.

Second dielectric layer 324 may be formed on layer 322 and may include a multi-layer structure, such as a first silicon oxide layer 325 and a second high dielectric constant (high-K) layer 326. High-K layer 326 may include, for example, an alumina, such as $Al_2O_3$. Dielectric layers 325 and 326 may together function as an inter-gate dielectric for memory cells 201. In alternate implementations, dielectric layer 324 may include a single layer, such as a silicon oxide or aluminum oxide.

Control gate 328 may be formed above second dielectric layer 324. Control gate 328 may be formed of, for example, polysilicon and may be connected to the word line of memory cell 201.

In operation, core area 102 of memory device 100 may be programmed by a channel hot electron injection process that injects electrons into charge storage layer 322. The injected electrons become trapped in charge storage layer 322 until an erase operation is performed.

Memory cells 201 in core array 102 may be programmed by applying a relatively high voltage (e.g., 10 volts) to one of the word lines WL, such as $WL_1$, which effectively applies the voltage to control gates 328 of the memory cells that are coupled to $WL_1$. Simultaneously, a voltage may be applied across drain 202 and source 203 of one of the memory cells in a group 225. For example, approximately five volts may be applied to $GBL_i$ and $GBL_{i+1}$ may be grounded. Also, select transistor S0 and S1 may be turned on by applying an appropriate voltage to S1. These voltages generate a vertical and lateral electric field in the activated memory cell(s) (e.g., the circled memory cell in FIG. 2) along the length of the channel from the source to the drain. These electric fields causes electrons to be drawn off the source and begin accelerating toward the drain. As they move along the length of the channel, they gain energy. If some of the electrons gain enough energy, they can jump over the potential barrier of the dielectric layer 320 into one side of charge storage layer 322 and become trapped. The trapped electrons change the electrical properties of memory cell 201, such as the threshold voltage Vt. In a read operation, the source and drain terminals are interchanged. For example, the corresponding read operation may be performed by applying approximately three volts to $WL_1$, grounding $GBL_i$, and applying approximately 1.5 volts to $GBL_{i+1}$, and the Vt of memory cell 201 can affect how much current can flow through channel region 315 of cell 201 from drain 202 to source 203 and thus indicate the state of the core cell as either in a programmed state having little current resulting from a high Vt, or an erased state having a higher current resulting from a low Vt.

Figure 4:
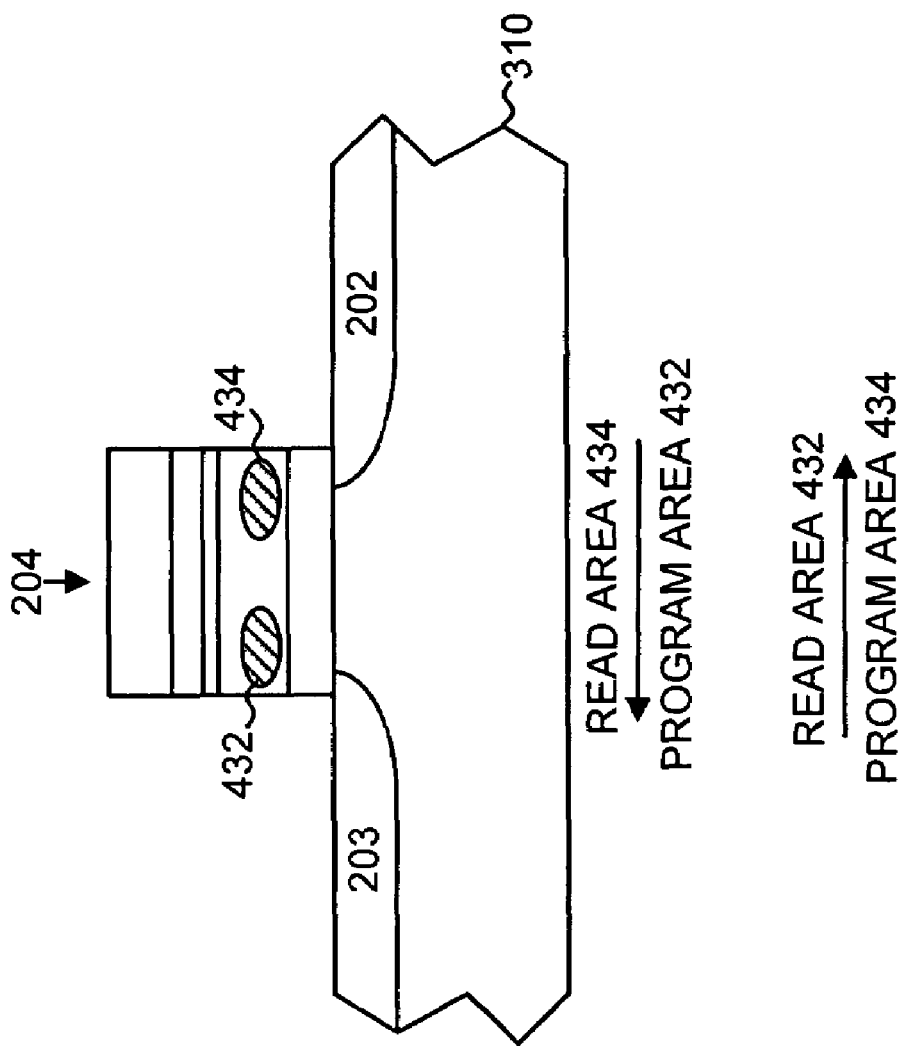

When two bits are stored in charge storage layer 322, the second bit is programmed in a manner similar to the first bit, except that the source and drain terminals are reversed in both directions. FIG. 4 is a diagram illustrating a cross-section of the exemplary dual-bit memory cell shown in FIG. 3. Additionally, FIG. 4 illustrates read and program directions for when memory cell 201 is used to store charges representing two independent bits. The arrows in FIG. 4 graphically illustrate the direction of current flow. It should be noted that the direction of current flow may be reversed in the case of negative charges.

Memory cell 201 includes two separate charge storage areas 432 and 434 within charge storage layer 322. Each storage area 432 and 434 may define one bit. In one implementation consistent with principles of the invention, programming either of charge storage areas 432, 434 may involve hot electron injection, also referred to as channel hot electron (CHE) injection. However, it should be appreciated that modifications to the programming techniques can be made to accommodate variations in the specific memory device used. Using hot electron injection, charge storage area 432 may be programmed by applying a selected voltage to area 203 (functioning as the drain). In addition, a selected voltage may be applied to the gate region 204. Area 202 functions as the source (i.e., source of electrons) for the CHE programming of charge storing area 432. In one implementation, area 202 may be grounded or floated.

As is known, voltages applied to the gate region 204, the source 202 and the drain 203 generate a vertical electric field through the dielectric layer 320 and the charge storage layer 322 and a lateral electric field along the length of the channel 315 from the source to the drain. At a given threshold voltage, the channel 315 will invert such that electrons are drawn off the source and begin accelerating toward the drain. As the electrons move along the length of the channel 315, the electrons gain energy and upon attaining enough energy, some of the electrons are able to jump over the potential barrier of dielectric layer 320 and into charge storage layer 322 where the electrons become trapped. The probability of electrons jumping the potential barrier is a maximum in the area of the charge storage area 432 adjacent area 203 (functioning as the drain), where the electrons have gained the most energy. These accelerated electrons are termed hot electrons and once injected into charge storage layer 322, will stay in charge storage element 432 within the charge storage layer 322. The trapped electrons tend not to spread through charge storage layer 322 due to this layer's low conductivity and low lateral electric field therein. Thus, the trapped charge remains localized in the designated charge storage area close to the adjacent drain area. During a read operation, electrons travel in an approximately opposite direction, as shown in FIG. 4.

The foregoing technique to program the first charge storage area 432 can also be used to program second charge storage area 434 by reversing the functions of the areas 202 and 203 (i.e., the drain and the source).

Figure 5:
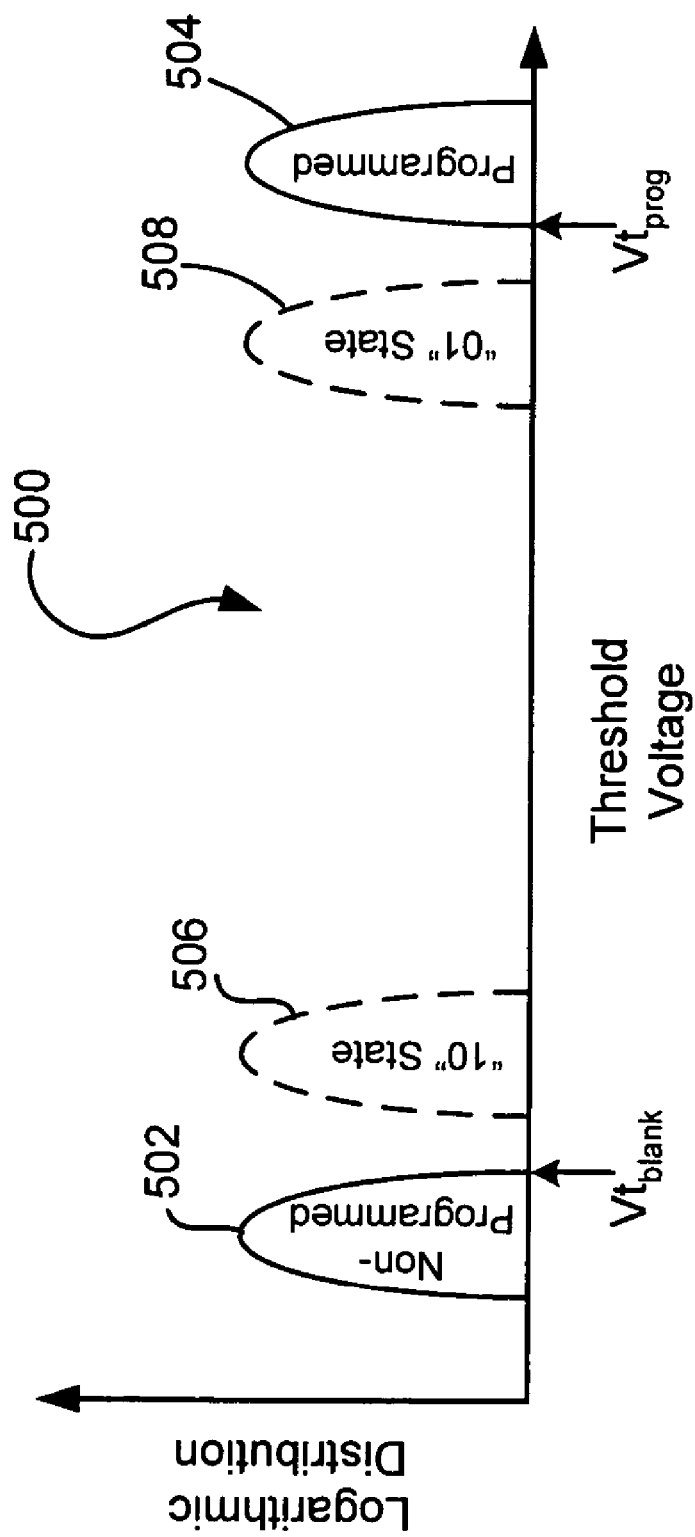
FIG. 5 is a population plot illustrating relative program level threshold voltage (Vt) distributions for the memory cell shown in FIG. 3, indicative of the data state behavior of the memory cell when charge storage areas are placed in various respective data states.

FIG. 5 is a population plot illustrating relative program level threshold voltage (Vt) distributions 500 for memory cells 201 indicative of the data state behavior of the memory cell 201 when charge storage areas 432 and 434 are placed in various respective data states. In this implementation, Vt may be measured or read with respect to charge storage area 432. A first distribution 502 represents a logarithmic threshold voltage distribution for the memory cell 201 when both charge storage areas 432 and 434 store respective charge amounts corresponding to the erased or non-programmed state. That is, when one of the charge storage areas 432 or 434 is read and both charge storage areas 432, 434 are in a non-programmed or "1" logical state, the threshold voltage of memory cell 201 should fall within the first distribution 502. Using the corresponding binary data values for this data storage condition, the first distribution 502 may be referred to as a "11" state, where the first "1" of the "11" corresponds to the charge storage area (432 or 434) being read (or "read bit") and the second "1" of the "11" corresponds to the other of the charge storage areas (432 or 434) (or "unread bit"). A maximum value of the first distribution 502 represents an erase or blank threshold voltage ($Vt_{blank}$) of memory cell 201.

A second distribution 504 represents a logarithmic threshold voltage distribution for memory cell 201 when both charge storage areas 432 and 434 store respective charge amounts corresponding to a programmed state. That is, when one of the charge storage areas 432 or 434 is read and both charge storage areas 432, 434 are in the programmed state, the threshold voltage of memory cell 201 should fall within second distribution 504. Using the corresponding binary data value for this data storage condition, second distribution 504 may be referred to as a "00" state, where the first "0" of the "00" corresponds to the read bit and the second "0" of the "00" corresponds to the unread bit. A minimum value of the second distribution 504 represents a programmed threshold voltage ($Vt_{prog}$) of memory cell 201.

A third distribution 506 represents a logarithmic threshold voltage distribution for the memory cell 201 when the read one of the charge storage areas 432, 434 stores a charge corresponding to the non-programmed state and the unread one of the charge storage areas 432, 434 stores a charge corresponding to the programmed state. Using the corresponding binary data value for this data storage condition and the first and second digit naming convention identified above, third distribution 506 may be referred to as a "10" state. The "10" state can also be referred to as a complimentary bit disturb (CBD) state since the charge stored by the unread bit has the effect of slightly increasing the threshold voltage of the memory cell 201 above the erased state distribution 502.

A fourth distribution 508 represents a logarithmic threshold voltage distribution for the memory cell 201 if the read one of the charge storage areas 432, 434 stores a charge corresponding to the program state and the unread one of the charge storage areas 432, 434 stores a charge corresponding to the non-programmed state. Using the corresponding binary data value for this data storage condition and the first and second digit naming convention identified above, the fourth distribution 508 may be referred to as a "01" state. In this situation, the differing charge amounts stored by the charge storage areas 432, 434 have the effect of slightly decreasing the threshold voltage of memory cell 201 below that of programmed state distribution 504. As previously mentioned, in accordance with the principles of the invention, multiple memory cells 201 in a row (i.e., the memory cells 201 having a common word line) may be simultaneously or parallel programmed by activating a word line and pairs of select transistors S0 through S7 in different groups 225. In addition, each bit line that is to be programmed may draw a fixed programming current from program voltage generator 122.

As described above, it should be understood that programming speeds for charge storage areas in multi-bit memory cells may depend on the program state of the other charge storage area in the cell. For example, if area 432 is programmed first, then, when programming 434 by applying high voltage on drain 202 and control gate 204, and grounding source 203, the electrons may gain the required energy to jump over the barrier 320 much more quickly due to the so-called source side injection mechanism. Accordingly, charge storage area 434 may programmed more quickly than if charge storage area 432 had not been previously programmed.

Memory Device Programming

In conventional dual-bit memory cells, the time it takes to program each bit is dependent, at least in part, upon the charge state of the other bit in the cell. For example, if charge storage area 432 is to be programmed (i.e., placed into "0" logic state) and charge storage area 434 has not been previously programmed (i.e., remains in a "1" logic state), it would take multiple (e.g., up to four) program pulses for charge storage area 432 to reach a verified programmed state.

More specifically, in typical operation, programming of charge storage area 432 may performed by grounding source 202 while maintain the word line voltages on control gate 204. Programming voltages may be applied to drain 203 as a pulse having a duration of, for example, 300 ns. After the pulsing, the drain voltage may be removed. At this point, the programmed bit undergoes programming verify to determine whether the bit has been programmed. In typical operation, the bit is not programmed following a single pulse application. In this case, a second drain pulse is applied after the word line is brought up to a high voltage, and the cell is subsequently verified to again determine whether it has been programmed. This continues until the bit passes verification, which typically takes about four pulses. However, it should be noted that programming may take less than or more than four pulses, and is based on the results of each verification process verify process.

Based upon the above description, it should be noted that, if charge storage area 432 is to be programmed and charge storage area 434 has been previously programmed, charge storage area 432 may be programmed and verified with the application of a fewer number of drain voltage pulses. This happens because, during prior programming of charge storage area 434, charge storage area 432 may also have experienced a not-insignificant raise in its threshold voltage due to the complimentary bit disturb effect described above. In practice, it has been found that often a single program pulse is sufficient to pass verification when programming a prior complimentary bit.

To take advantage of this feature, selected memory cells 201 in device 100 may be pre-conditioned to place a designated one of their charge storage areas (432, 434) into a programmed state, in accordance with principles of the present invention. Following pre-conditioning, the remaining charge storage area (432, 434) may form the memory element for the cell 201.

Figure 6:
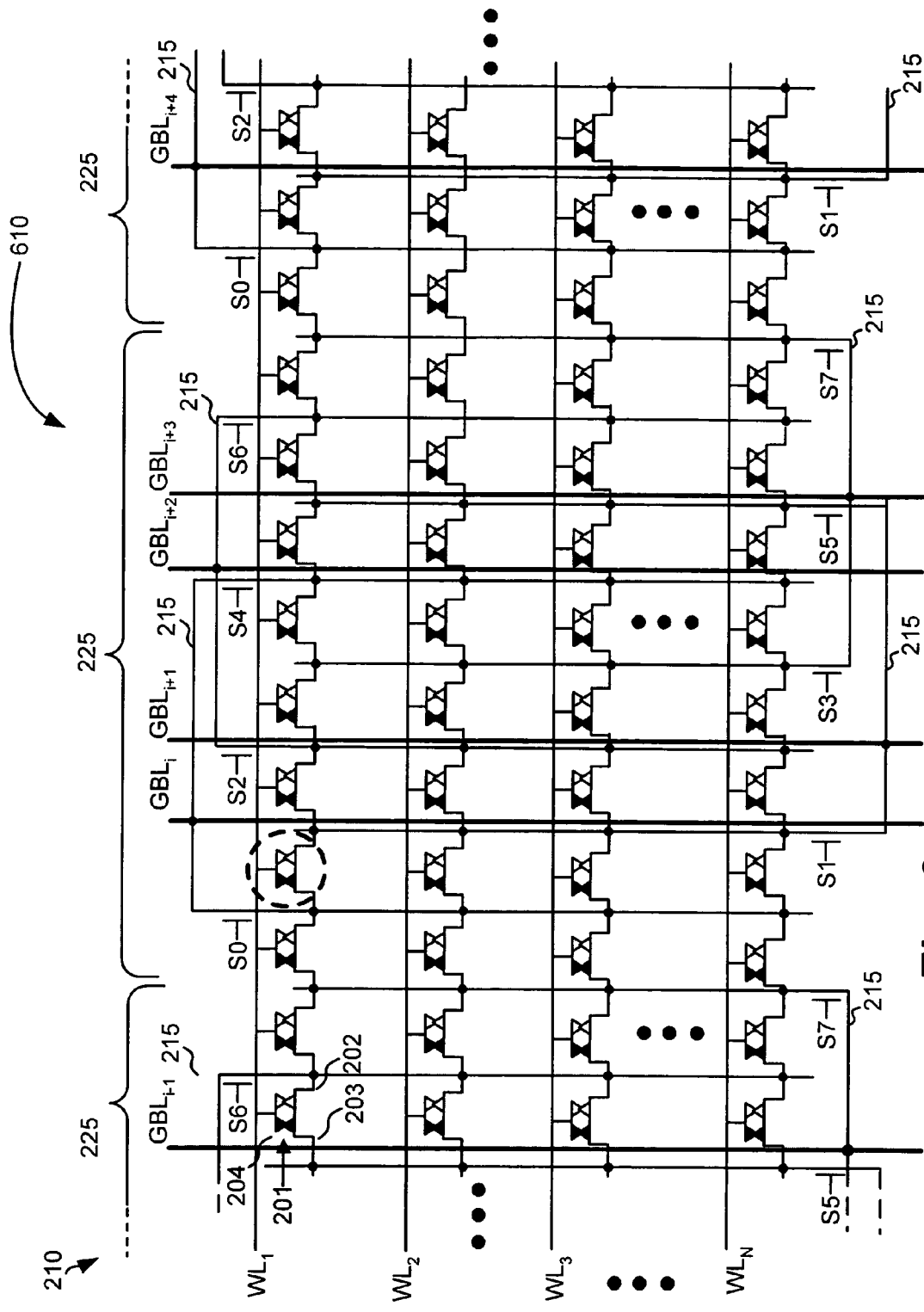
FIG. 6 is a diagram illustrating an exemplary pre-conditioned block of an array of memory cells implemented in the core area shown in FIG. 1.
Figure 7:
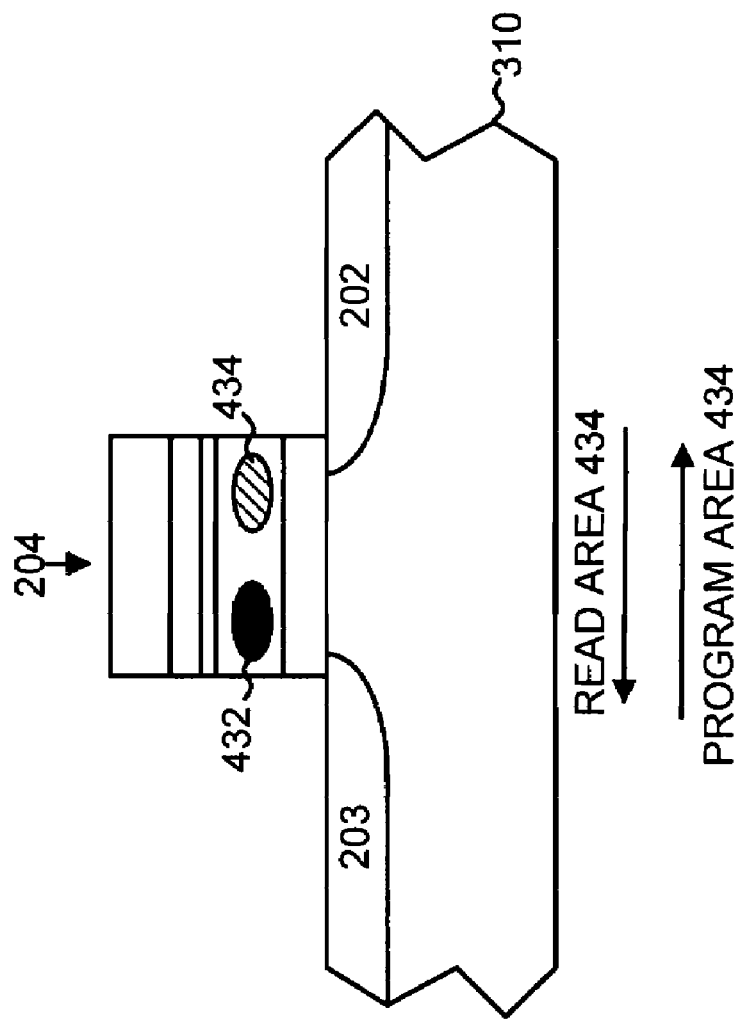
FIG. 7 is a diagram illustrating a cross-section of an exemplary one of the memory cells shown in FIG. 6.

FIG. 6 is a diagram illustrating a portion of a grouping or block 610 of memory cells 201 within array 210, where cells 201 are pre-conditioned in the manner briefly described above. As shown in the figure, one designated charge storage element of each memory cell 201 may pre-conditioned or programmed to place the designated charge storage element into a programmed state. Such a pre-conditioned memory cell is further illustrated in the detailed cross-section illustration of FIG. 7. As shown in FIG. 7, charge storage element 432 is pre-conditioned and placed into a programmed state in advance of a programming operation. In this manner, charge storage element 434 may be used as the cell 201's memory element. As described above, pre-conditioning of charge storage element 432 significantly decreases the time taken to necessarily program remaining charge storage element 434.

FIGS. 8 and 9 are flow charts illustrating exemplary programming of a memory device such as memory device 100. More specifically, FIG. 8 relates to a pre-conditioning process and FIG. 9 relates to subsequent programming of the pre-conditioned cells. Referring to FIG. 8, a memory cell or group of memory cells may be initially designated as high-speed memory cells (act 802). In one implementation, memory cells 201 in memory device 100 may be configured or identified in predefined groupings or "blocks" (e.g., block 610 of FIG. 6). In one exemplary implementation, core array 102 may have a density ranging from 512-megabits to 8-gigabits. Furthermore, core array 102 may be further broken down into blocks ranging from small sized blocks such as 129-kilobit blocks to larger 128-megabit blocks. Accordingly, a 1-gigabit array 102 may include eight 128-megabit blocks, or alternatively, one-thousand twenty four 128-kilobit blocks. By defining groups of cells into blocks, an indication regarding the program mode (e.g., normal program mode or high-speed program mode) of each memory cell in the block may be stored as a status or indication bit associated with the block. In this manner, programming of a high-speed block of memory cells may be triggered by reading the logical value of the associated status or indication bit. In one implementation, the status bit may be maintained in a NOR-type flash memory cell outside of core array 102 in a so-called "spare area" associated with core array 102. Additionally, the status bits of block in array 102 may be monitored by users to determine the number of high-speed and normal mode blocks in array, thereby indicating a total available program density. Upon return of the high speed memory cells to a normal program mode, the associated status bit may be reset.

In one implementation consistent with principles of the invention, designation of memory cells as high-speed memory cells may be performed upon device fabrication or assembly. In another exemplary embodiment, such designation may be performed by an end user or device manufacturer subsequent to memory device fabrication.

Once one or more blocks of memory cells 201 have been designated as high-speed, each memory cell in the designated blocks may be pre-conditioned to place one of the charge storage areas (e.g., area 432) of each memory cell 201 into a programmed (e.g., "0") state (act 804). Consequently, following designation of a memory cell as a high-speed memory cell, only one bit (i.e., the non-programmed charge storage area 434) is available to users for data storage, with the other bit (i.e., the pre-conditioned charge storage area 432) maintaining a programmed state necessary to accelerate the program speed of the non-programmed charge storage area from four pulses to one pulse.

Once pre-conditioned, it is determined whether the pre-conditioning was sufficient to place the desired bit into a programmed state (act 806). If not, the process returns to act 804 for application of an additional pre-conditioning pulse. However, if it is verified that the designated bit is pre-conditioned, the status bit associated with the designated block(s) may be set, indicating that those blocks are high-speed blocks (act 808). The pre-conditioning of the designated bit places may be represented by distribution 506 of FIG. 5.

Turning to FIG. 9, a program command may be received for one or more of the pre-conditioned memory cells (act 902). A gate voltage and suitable programming pulse may then be applied to gate 204 and drain 202, respectively, to inject electrons into the available charge storage area (e.g., charge storage area 434) sufficient to raise the cell's threshold voltage above a reference threshold (act 904). This state may be represented by distribution 504 in FIG. 5. The memory cell or cells may then be program verified by sensing a current on the bit line(s) associated with the memory cell or cells by Y-decoder/sense amplifier circuitry 108 (act 906). If they pass verify, the operation is complete; however, if they do not pass verify, the process returns to act 904 for application of an additional programming pulse.

Because the status bit associated with the block high-speed memory cells indicates the high-speed nature of the cells in block 610, any block or number of blocks in core array 102 may be designated as high-speed blocks. For each high-speed block, during programming, the first bit or charge storage area is continually maintained in a programmed or "0" state, thus providing the programming speed advantages set forth above. During an erase operation, all the bits in the block are erased regardless of their status.

FIG. 10 is a flowchart illustrating one exemplary process for designating group or memory cells as normal mode memory cells. Initially, one or more blocks of memory cells may be designated as normal mode memory cells (act 1002). Once one or more blocks of memory cells 201 have been designated as "normal", each memory cell in the designated blocks may be completely erased to place each of the charge storage areas 432 and 434 of each memory cell 201 into a erased (e.g., "1") state (act 1004).

Once erased, it is verified whether the erasing process was sufficient to place the desired bit into an erased state (act 1006). If not, the process returns to act 1004 for application of an additional erase voltage or pulse. However, if it is verified that the designated block of cells was erased, the status bit associated with the designated block(s) may be reset to indicate that those blocks are normal mode blocks (act 1008). The erasing of the designated cells may be represented by distribution 502 of FIG. 5.

By enabling designation of memory cells or blocks of memory cells as either normal mode or high-speed memory cells, users may therefore use any portion of memory cells in core array 102 as high-speed memory and may adjust the number of cells designated as high-speed memory cells based on the particular requirements of an application. Additionally, as described above, previously designated high-speed memory cells may be converted to normal mode memory cells and vice-versa at the discretion of the user. Furthermore, it should be noted that, once designated as high-speed blocks, memory cells in these blocks may be read from in a similar manner to conventional normal mode or non-high-speed blocks, thus enabling efficient transfer of data from normal mode memory cells to high-speed memory cells and vice-versa.

In this manner, capacity of high-speed memory cells may be maximized by writing data from the high-speed cells to normal mode cells following initial programming. For example, if initially rapid programming is required, such as when capturing digital images, high-speed memory cells may be utilized. Following initial capture, however, the digital images may be transferred from high-speed cells to normal mode cells which may be operated in the background (not visible to users), thereby providing high speed for the users and conserving high-speed cells for use during subsequent image captures. Transfers of this type may be referred to as "copyback" transfers.

Although the above description specifically references dual-bit memory cells capable of storing two distinct bits of data, the invention may be adapted to improve programming speeds for memory cells capable of storing more than two memory cells.

CONCLUSION

As described above, a number of programming techniques, such as high-speed memory cell designation to substantially increase programming speed in a NOR-based memory device. A resulting memory device continues to exhibit the code-quality performance of NOR-based devices, while further exhibiting programming speed and power capabilities comparable to or exceeding those of conventional NAND-based flash memory devices.

The foregoing description of exemplary embodiments of the invention provides illustration and description, but is not intended to be exhaustive or to limit the invention to the precise form disclosed. Modifications and variations are possible in light of the above teachings or may be acquired from practice of the invention.

Moreover, while series of acts have been described with regard to FIG. 6, the order of the acts may be varied in other implementations consistent with the invention. Moreover, non-dependent acts may be implemented in parallel.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed:

1. A method of programming a nonvolatile memory device including an array of memory cells, each memory cell including a charge storage element having at least two charge storage areas for storing at least two independent charges, the method comprising:
   designating a plurality of memory cells as high-speed memory cells; and
   pre-conditioning the high-speed memory cells to place a first one of the at least two charge storage areas into a programmed state.

2. The method of claim 1, wherein the memory cells are dual-bit memory cells having two charge storage areas.

3. The method of claim 1, further comprising:
   setting a status bit associated with the high-speed memory cells.

4. The method of claim 1, further comprising:
   receiving a program command to program the high-speed memory cells; and
   programming the high-speed memory cells to place a second one of the at least two charge storage areas into a programmed state.

5. The method of claim 4, wherein programming the high-speed memory cells, further includes applying a program pulse to the high speed memory cells.

6. The method of claim 5, further comprising:
   verifying that the high-speed memory cells have been programmed.

7. The method of claim 1, further comprising:
   transferring data from the high-speed memory cells to memory cells in the array that have not been designated as high-speed memory cells.

8. The method of claim 1, further comprising:
   designating the high-speed memory cells as normal mode memory cells;
   erasing the high speed memory cells to place the first one of the at least two charge storage areas for each of the high-speed memory cells into a non-programmed state; and resetting a status bit associated with the high-speed memory cells.

9. The method of claim 1, wherein the array of memory cells comprises a 1-gigabit array of NOR-type dual-bit memory cells.

10. The method of claim 9, wherein the 1-gigabit array of NOR-type memory cells includes multiple 128-megabit blocks of memory cells.

11. The method of claim 10, comprising:
designating at least one block of memory cells as a high-speed block of memory cells; and
pre-conditioning the at least one block of high-speed memory cells to place the first of the at least two charge storage areas for each memory cell in the at least one block of high-speed memory cells into a programmed state.

12. A method for programming a memory device including an array of non-volatile memory cells, each memory cell including a charge storage element having two charge storage areas for storing two independent charges, the method comprising:
configuring the array of non-volatile dual-bit memory cells into one or more blocks of memory cells;
receiving a request to use at least one block of memory cells as a high-speed block;
pre-conditioning the memory cells in the high-speed block to place a first of the at least two charge storage areas for each memory cell in the high-speed block into a programmed state; and
setting a status bit associated with the high-speed block to indicate that the block is a high-speed block.

13. The method of claim 12, wherein the memory cells are SONOS (silicon-oxide-nitride-oxide-silicon) type NOR memory cells.

14. The method of claim 12, comprising:
receiving a request to program one or more memory cells in the high-speed block;
applying a program pulse to the requested memory cells to place a second of the at least two charge storage areas for each requested memory cell into a programmed state; and
verifying that the memory cells in the high-speed block have been programmed.

15. The method of claim 12, comprising:
receiving a request to transfer data between the high-speed block and another block; and
transferring the data from a second of the at least two charge storage areas for each memory cell in the high-speed block to either the first or second charge storage areas in a memory cell in the another block.

16. The method of claim 12, comprising:
receiving a request to return the high-speed block to a normal mode block;
applying erase pulses to each memory cell in the high-speed block to place both the first and second charge storage areas into non-programmed states; and
resetting the status bit to indicate that the block is a normal mode block.

17. A memory device comprising:
a core array including at least one array of non-volatile memory cells, the at least one array comprising:
a plurality of bit lines each connected to source or drain regions of a plurality of the memory cells, the plurality of memory cells comprising:
a substrate;
a control gate;
a charge storage element having at least two charge storage areas for storing at least two independent charges;
a source region; and
a drain region; and
a plurality of word lines, arranged orthogonally to the bit lines, each word line being connected to gate regions of a plurality of the memory cells;
a plurality of sense amplifiers operatively connected to the plurality of bit lines for sensing a threshold voltage for memory cells connected to the bit lines;
control logic configured to receive a command identifying one or more memory cells to be configured as high-speed memory cells;
control logic configured to pre-condition a first of the at least two charge storage areas of each of the high-speed memory cells to place the first charge storage area into a programmed state; and
control logic configured to set a status bit associated with the one or more memory cells, indicating that the one or more memory cells are high-speed memory cells.

18. The memory device of claim 17, wherein the memory cells are dual-bit NOR-type memory cells configured to include two charge storage areas for storing two independent charges.

19. The memory device of claim 17, comprising:
control logic configured to receive a command to program one or more of the high-speed memory cells; and
control logic to apply a programming pulse to the one or more of the high-speed memory cells, thereby placing the second charge storage area into a programmed state.

20. The memory device of claim 17, comprising:
control logic configured to receive a command to erase one or more programmed high-speed memory cells; and
control logic to apply an erase pulse to the one or more programmed high-speed memory cells, thereby placing the second charge storage area into a non-programmed state.

21. A memory device comprising an array of memory cells, the array of memory cells including:
a first plurality of memory cells configured as normal mode memory cells;
a second plurality of memory cells configured as high-programming rate mode memory cells,
where each of the memory cells in the first plurality of memory cells and the second plurality of memory cells includes at least two charge storage areas; and
control logic configured to adjust the number of memory cells associated with the first plurality of memory cells and the second plurality of memory cells based on an input command,
where the control logic is configured to pre-condition a selected memory cell in the first plurality of memory cells to place one of the at least two charge storage areas into a programmed state, thereby removing the selected memory cell from the first plurality of memory cells and placing the selected memory cell into the second plurality of memory cells.

22. The memory device of claim 21, wherein each of the second plurality of memory cells includes one bit available for programming and each of the first plurality of memory cells includes two bits available for programming.

* * * * *